United States Patent [19]
Taylor

[11] 4,204,275
[45] May 20, 1980

[54] UNISOLATED EAROM MEMORY ARRAY

[75] Inventor: David L. Taylor, Melbourne, Fla.

[73] Assignee: Harris Corporation, Melbourne, Fla.

[21] Appl. No.: 953,317

[22] Filed: Oct. 20, 1978

[51] Int. Cl.² .................. G11C 11/40; G11C 13/00
[52] U.S. Cl. ............................... 365/163; 307/279
[58] Field of Search .................. 365/163, 174, 182; 307/238, 279, 303

[56] References Cited
U.S. PATENT DOCUMENTS

| | | | |
|---|---|---|---|
| 3,699,543 | 10/1972 | Neale | 365/163 |
| 3,875,566 | 4/1975 | Hezbers | 365/163 |

Primary Examiner—Terrell W. Fears
Attorney, Agent, or Firm—Leitner, Palan, Lyman, Martin & Bernstein

[57] ABSTRACT

A monolithic memory array including an NPN emitter follower and low threshold amorphous material storage device at each cell without additional cell isolation. An N-type substrate forms a common collector, a plurality of spaced rows of P-type regions form the bases and a plurality of N-type regions form emitters. The amorphous devices are formed over the space between the P-type regions and are longitudinally aligned with a respective emitter and base contact area.

8 Claims, 9 Drawing Figures

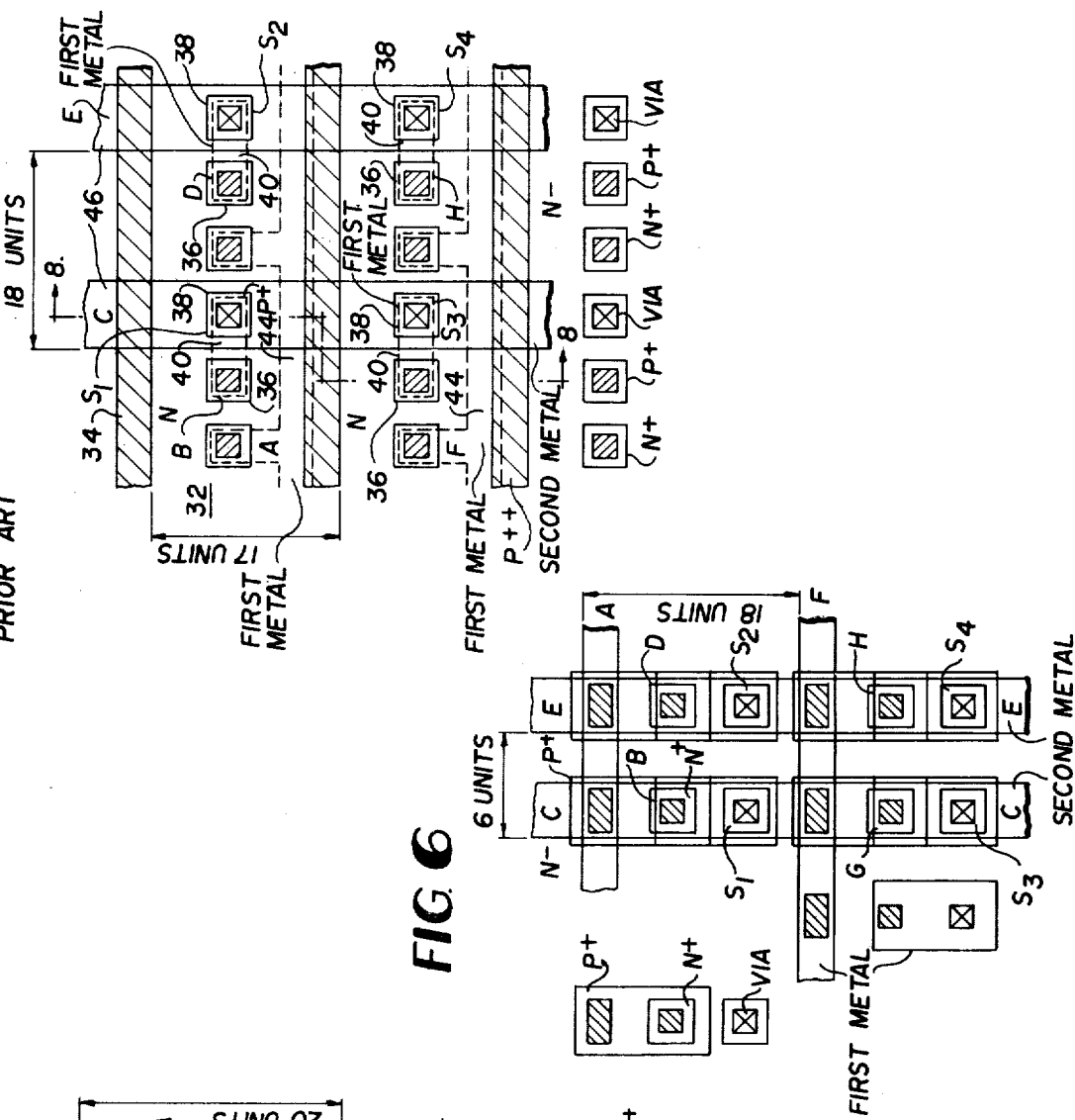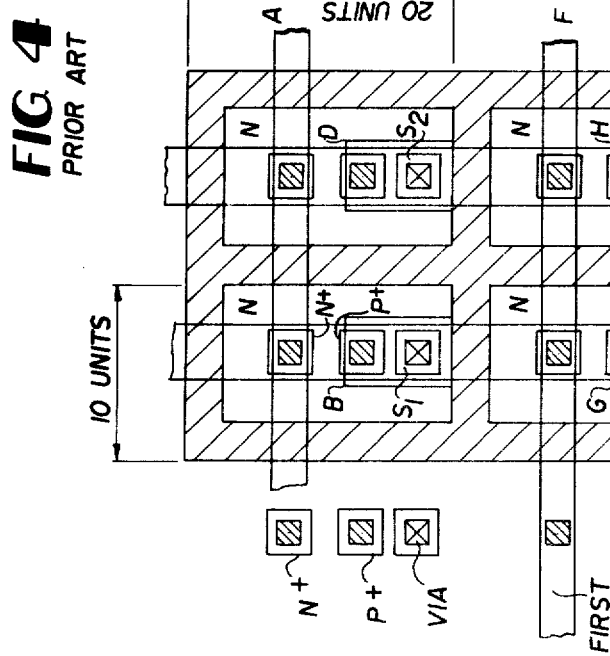

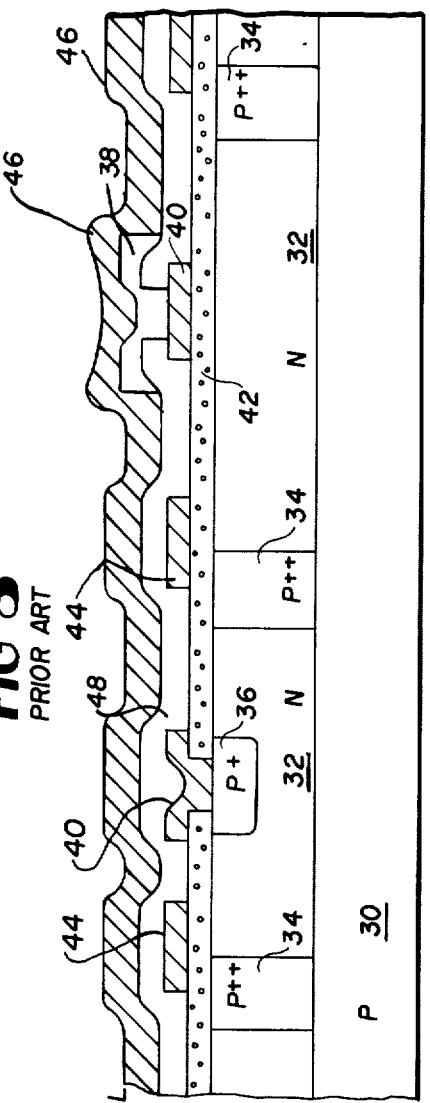
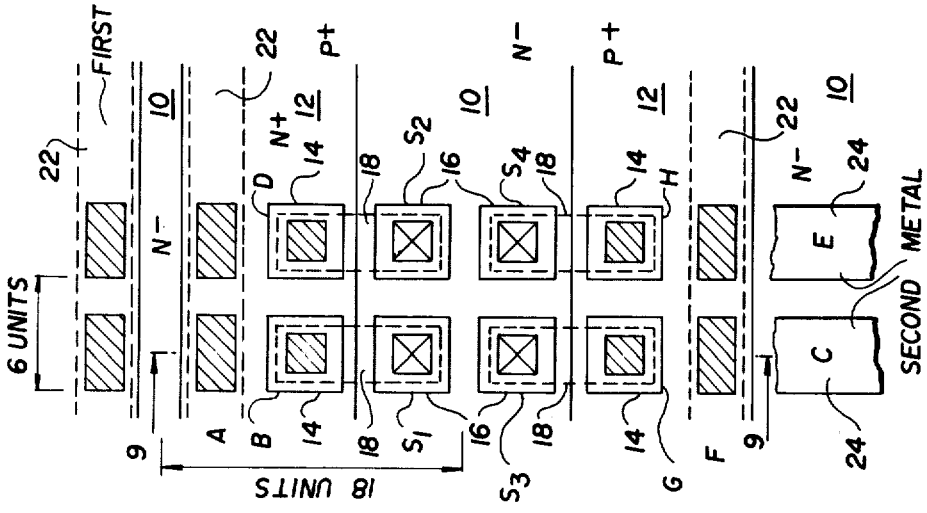

UNISOLATED EAROM MEMORY ARRAY

BACKGROUND OF THE INVENTION

The present invention relates generally to electrically alterable read only memory arrays (EAROM) and more specifically to an amorphous memory array using emitter follower configured bipolar transistors.

The present state of the-art of monolithic devices in amorphous technologies is limited to devices whose threshold voltages are very high, namely in the 10–20 volt range. This limitation arises from the desire to obtain devices with threshold characteristics which are suitable for high temperature operation. In programmable memory devices this limitation restricts the type of memory element which may be employed in the memory array. Prior techniques have utilized diodes and PNP transistors as the memory element in order to accommodate the high voltage necessary for switching of the amorphous elements. The use of diodes and PNP transistors requires that the matrix devices be isolated, and, hence restricts the memory array size.

The use of diodes and PNP emitter followers is described in U.S. Pat. No. 3,699,543 to Neale issued Oct. 17, 1972. The use of diodes, FET and bipolar transistors is discussed on pages 19–32 of thesis of C. H. Sie entitled "Memory Cell Using Bistable Resistivity in Amorphous As-Te-Ge Film" Iowa State University, May 1969.

A schematic and topological representation of an integrated circuit of a diode array and PNP emitter follower array of the prior art and the NPN emitter follower array of the present invention are illustrated in FIGS. 1 and 4, 2 and 5, and 3 and 6 respectively. Diodes $D_1$, $D_2$, $D_3$ and $D_4$ and transistors $Q_1$, $Q_2$, $Q_3$ and $Q_4$ each isolate amorphous storage devices $S_1$, $S_2$, $S_3$ and $S_4$ respectively. Lines A and F represent row select or word lines and lines C and E represent column select or bit lines.

As illustrated in FIG. 4, each of the diodes $D_1$, $D_2$, $D_3$, $D_4$ and respective storage devices $S_1$, $S_2$, $S_3$, $S_4$ are surrounded by junction isolation P++. A single cell has a width of ten units and a length of 20 units resulting in a surface area of 200 units. The PNP emitter follow of FIG. 5 requires a high impurity P++ region to junction isolate the rows of common bases. By using a common N-type base region for a row, the lateral isolation between the cells in a row is eliminated and a cell width of eighteen units compared to twenty units is possible. The cell length is seventeen units resulting in a surface area of 306 units. The NPN emitter follower of the present invention requires no isolation and is illustrated in FIG. 6 having a cell width of six units and length of eighteen units resulting in a surface area of 108 units. Thus, the electrical isolation requirements of diodes and PNP transistors increase the surface area used per cell.

By utilizing amorphous materials which have significantly improved temperature characteristics, lower switching threshold devices may be used-in the range of four to seven volts. These lower threshold devices then permit the use of NPN emitter follower devices as isolating elements in the memory array. Since an array of emitter follower devices with all collectors connected together does not require any isolation, the achievable memory array size is significantly increased. Diodes and PNP transistors were previously used with high switching threshold amorphous devices because of their high reverse breakdown voltage.

SUMMARY OF THE INVENTION

The electrically alterable read only memory array of the present invention minimizes surface area by providing a monolithic array without device isolation by using NPN bipolar transistors at each cell. Each cell includes an NPN emitter follower as the isolation device and an amorphous material storage element having a threshold below ten volts. The monolithic circuit includes an N-conductivity type substrate as a common collector for all the emitter follower configured bipolar transistors. A plurality of P-conductivity type regions are formed in the substrate parallel to each other and spaced longitudinally as rows of P-type base regions. A plurality of N-conductivity type emitter regions are formed in the P-type regions to produce an array. A plurality of low threshold amorphous material storage devices are formed on the substrate longitudinally aligned with their respective N-type emitter region to form rows of the array. A plurality of lateral conductors each contacting a P-type region at a surface area longitudinally aligned with each N-type emitter region in a row and a plurality of longitudinal conductors each contacting a surface of each of the amorphous devices in a column are provided. The elimination of device isolation and specific alignment of the base contact, emitter regions and amorphous devices minimizes the area needed per cell.

An object of the invention is to provide an unisolated, monolithic, amorphous storage memory array.

Another object is to provide a minimum area memory array using low threshold amorphous material storage elements.

A further object of the invention is to reduce the surface area required for an amorphous storage device cell by using NPN emitter follower configured isolation device for the cell.

Still another object of the invention is to minimize the memory array surface area by unique arrangements of the cell elements.

Other objects, advantages and novel features of the present invention will become apparent from the following detailed description of the invention when considered in conjunction with the accompanying drawings.

BRIEF DESCRIPTION OF THE DRAWINGS

FIG. 4 is a topographical view of an integrated circuit of the diode isolated array of FIG. 1.

FIG. 5 is a topographical view of an integrated circuit of the PNP isolated amorphous memory array of FIG. 2.

FIG. 6 is a topographical view of an integrated circuit of the NPN amorphous array of FIG. 3 incorporating in the principles of the present invention.

FIG. 7 is a topographical view of another embodiment of an integrated circuit incorporating the principles of the present invention.

FIG. 8 is a cross-sectional view of an integrated circuit taken along lines 8—8 of FIG. 5.

FIG. 9 is a cross-sectional view of an integrated circuit taken along lines 9—9 of FIG. 7.

DESCRIPTION OF THE PREFERRED EMBODIMENTS

Figure 1:
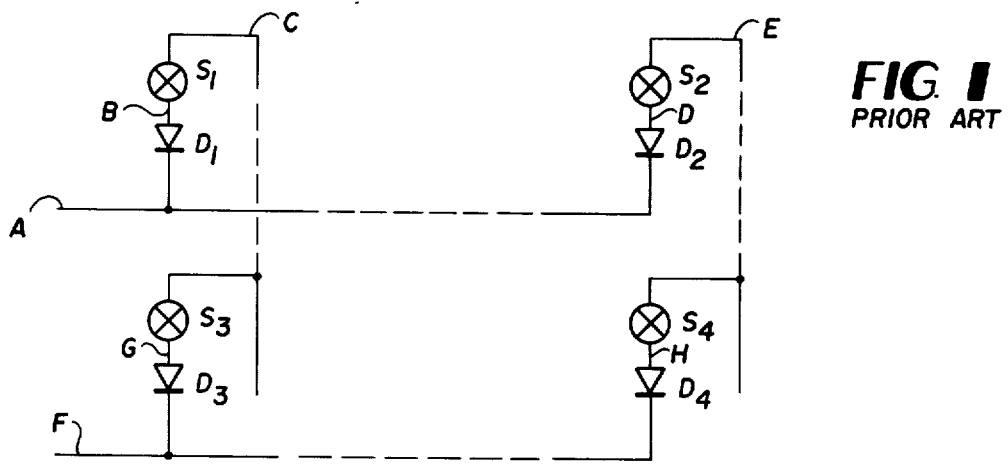
FIG. 1 is a schematic of a diode isolated amorphous memory array of the prior art.

FIGS. 7 and 9, which illustrate a preferred embodiment of the isolated memory array, shows an N− substrate 10 having a plurality of P+ regions 12 formed therein. The substrate 10 constitutes a common collector for all the emitter follower configured bipolar transistors and the P+ regions 12 form the base regions. P+ regions 12 are parallel to each other and longitudinally spaced in the N− substrate 10. This provides a common base region for each of the bipolar transistors of a row of the memory array. A plurality of N+ regions 14 are formed in the base regions 12 to form an array. The N+ regions 14 constitute the emitter of the NPN bipolar polar transistors. Longitudinally aligned with each of the N+ emitter regions 14 is an amorphous material storage device 16.

A first level metal 18 interconnects the emitter 14 through an insulative layer 20 and a respective amorphous device 16. The first level metal also includes a plurality of parallel lines 22 contacting the base regions 12 through the insulative layer 20 and surface areas longitudinally aligned with respective emitter 14. The second level metal includes a plurality of parallel lines 24 which are orthogonal to the first metal lines 22 making contact to the top surface of amorphous devices 16 which contact metal 18 in their respective columns through an insulative layer 26. Amorphous devices 16 are formed vertically above the portion of the substrate 10 between the longitudinally spaced P-type regions 12.

FIG. 6 is substantially identical to FIG. 7 wherein the difference being that in FIG. 7 a pair of amorphous devices 16 are adjacent to each other whereas in FIG. 6, the amorphous devices 16 are separated by a cell length.

By comparison, the PNP emitter follower array as illustrated in FIGS. 5 and 8 includes a substrate 30 forming a common collector and a plurality of N-type base regions 32 separated from each other by a high impurity P++ region 34. A plurality of P+ emitters 36 are formed in the base regions 32. Amorphous devices 38 are formed adjacent each emitter region 36. A first level metal 40 connects the amorphous device 38 to a respective emitter 36 through an opening in insulating layer 42. The first level metal also includes a plurality of parallel row lines 44. A plurality of parallel column lines 46 are formed orthogonal to the row lines 44 and are connected to respective amorphous devices 38. The column lines 46 form the second layer of metal. As can be seen from the comparison of FIGS. 4, 5 and 6, the elimination of the need of isolation of prior art diode arrays or PNP emitter follower arrays allows the cell to occupy a minimum amount of surface area. Similarly by applying the contact to the back surface of the substrate through the common collector, additional surface area is eliminated. The unique positioning of the base contact, the emitter and the amorphous device similarly reduces the surface area required per cell.

For high switching threshold amorphous devices, namely greater than ten volts, diodes and PNP transistors were required because of their high breakdown voltage. Referring to the schematic of FIG. 2 assume that amorphous storage devices $S_2$, $S_3$ and $S_4$ are low impedance and amorphous storage device $S_1$ is a high impedance. To switch $S_1$ to a low impedance, assuming a threshold of 20 volts, point A is set to a low voltage level, for example ground, and point C is raised to a high voltage level, for example 21 volts. Since point B would be at approximately 0.8 volts, the threshold of $S_1$ would be reached and it fire. The setting of $S_1$ would is accomplished by the application of a fixed current for a fixed duration. Since point C is at 21 volts, point F is at approximately 20.2 volts. Since point A is at ground, point E is at 0.8 volts. Thus the voltage across the base to emitter of transistor $Q_4$ would be approximately 20.2 volts minus 0.8 volts which equals 19.4 volts. Thus the base to emitter breakdown for the PNP transistors $Q_1$ through $Q_4$ must be greater than the 19.4 volts or the parasitic current would cause transistor $Q_4$ to conduct and damage amorphous storage devices $S_4$. For an amorphous storage device having a switching threshold of 10 volts, the emitter to base breakdown voltage would have to be greater than 8.2 volts.

Figure 2:
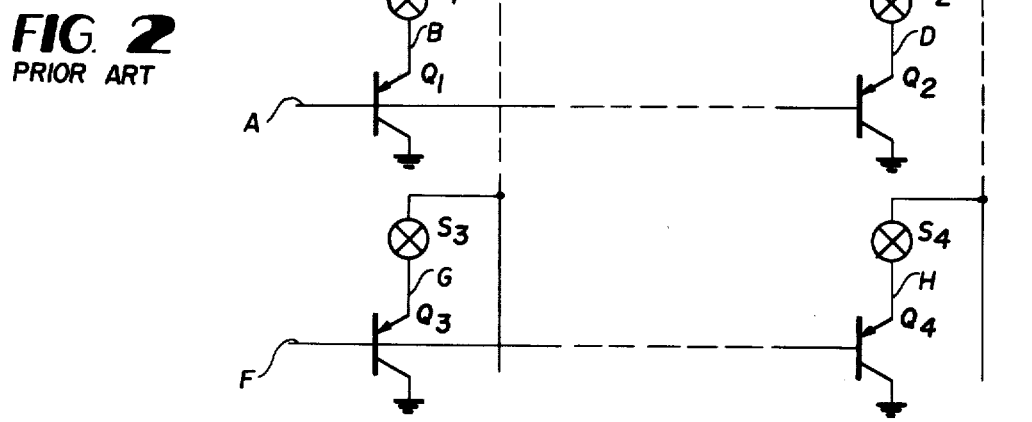
FIG. 2 is a schematic of a PNP emitter follower isolated amorphous array of the prior art.

An analysis of the diode isolation of FIG. 1 would be identical to that described for the PNP emitter follower in FIG. 2 except the only difference would be in the current flow path wherein all the current in line C would flow into line A whereas in FIG. 2 the current in line C would be split between line A and ground according to the beta characteristic of the PNP transistor.

Figure 3:
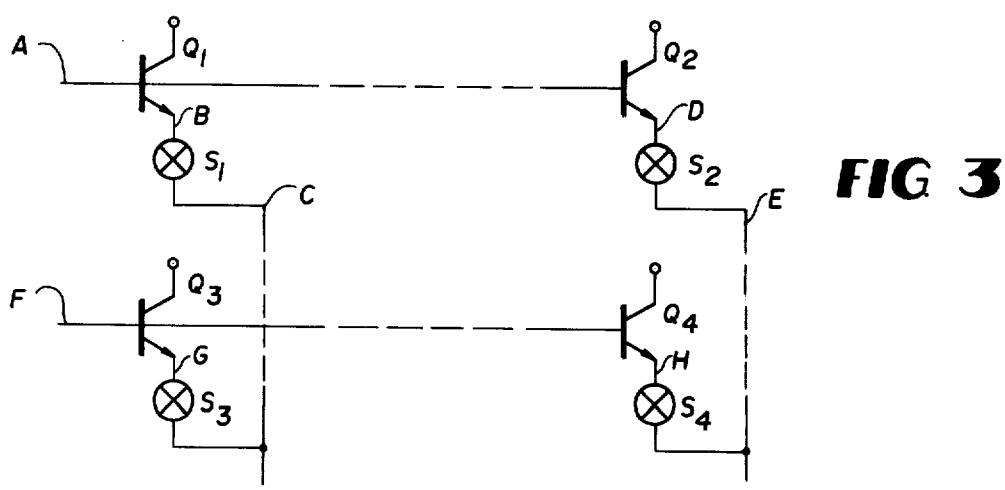
FIG. 3 is a schematic of an NPN amorphous array incorporating the principles of the present invention.

Since NPN transistors do not have extremely high emitter to base breakdown voltages, they cannot be used with high switching threshold amorphous storage devices. Using the analysis of FIG. 2, of the schematic of FIG. 3 incorporating the principles of the present invention, for switching threshold voltage of 6 volts, and a column select voltage of 7 volts, an emitter base breakdown of 7 volts is sufficient. This is well within the emitter to base breakdown voltage of NPN transistors. More specifically, when Point A is taken high to, for example, 7 volts, point B would be at approximately 6.2 volts. A common collector would also be raised to the high voltage or 7 volts in order to keep the base to collector junction of the emitter followers at zero or reversed biased. Since the switching threshold of amorphous storage bias $S_1$ is exceeded, it fires and a sufficient current is applied for a fixed duration to accomplish setting of the device $S_1$. Since point A is at 7 volts, points D and E are at approximately 6.2 volts and if line F is deselected by a low voltage of approximately ground, 6.2 volts is applied across the emitter base junction of $Q_4$. Since emitter to base breakdown voltages of at least 7 volts are availble in NPN transistors, no parasitic current paths are possible.

Although lower threshold amorphous devices must be used with NPN emitter follower arrays according to the present invention, the achievable density is substantially greater. Thus the present invention provides the ability to minimize space for environments where temperature is not critical. This alternative was not available in the prior art.

From the preceding description of the preferred embodiment, it is evident that the objects of the invention are attained and although the invention has been described and illustrated in detail, it is to be clearly understood that the same is by way of illustration and example only and not to be taken by way of limitation. The spirit and scope of this invention being limited only by the terms of the appended claims.

What is claimed is:

1. In a memory array having at each cell of said array a bipolar transistor in an emitter follower configuration and an amorphous material storage device, the improvement at each location comprising:

said bipolar transistor being an NPN bipolar transistor; and said amorphous device having a switching threshold in the range of four to eight volts.

2. The memory array of claim 1 wherein said array is formed in a substrate without device isolation, and said substrate forming a common collector for each transistor.

3. The memory array of claim 2 including means for positivily biasing said substrate.

4. A bipolar monolithic memory array comprising:
an N-conductivity type substrate;
a plurality of P-conductivity type regions in said substrate each of said P-conductivity type regions extending laterally and being spaced from each other in a longitudinal direction to form a plurality of longitudinally spaced rows of P-conductivity type regions,
a plurality of N-conductivity type regions located within each of said P-type regions, the N-conductivity type regions within a P-conductivity type region being spaced laterally from each other,
a plurality of memory means for programably retaining a logic state, one of said memory means being associated with each N-conductivity type region, each of said memory means being aligned in a longitudinal direction with its respective N-conductivity type region to form columns of memory means;
a plurality of laterally extending conductors each contacting a P-conductivity type region at a plurality of surface areas, each of said surface areas being associated with and being longitudinally aligned with a different one of each of the N-conductivity type regions associated with said P-conductivity type region forming a row; and
a plurality of logitudinally extened conductors each contacting a surface of each memory means in a column.

5. The monolithic memory array according to claim 4 wherein said substrate is positively biased to form a common collector, said P-type regions are biased to form bases and said N-type regions are biased to form emitters.

6. The monolithic memory array of claim 4 or 5 wherein said memory means are each amorphous material storage devices with switching thresholds below ten volts.

7. The monolithic memory array of claim 4 wherein said memory means are vertically above the portion of said substrate longitudinally separating said P-type regions.

8. The monolithic memory of claim 7 wherein a single P-type region with a plurality of N-type regions therein forms a single row of the array.

* * * * *